(12) United States Patent
Kim et al.

(10) Patent No.: US 11,467,205 B2
(45) Date of Patent: Oct. 11, 2022

(54) SUBSTRATE TESTING APPARATUS

(71) Applicant: SAMSUNG ELECTRONICS CO., LTD., Suwon-si (KR)

(72) Inventors: Kyoonwoo Kim, Hwaseong-si (KR);
Jaehun Lee, Hwaseong-si (KR);
Taejun Park, Hwaseong-si (KR);
Sanghun Lim, Hwaseong-si (KR);
Seokyung Kim, Yongin-si (KR);
Junnyeon Jeong, Hwaseong-si (KR)

(73) Assignees: SAMSUNG ELECTRONICS CO., LTD.; HAMAMATSU PHOTONICS KOREA CO., LTD.

( * ) Notice: Subject to any disclaimer, the term of this patent is extended or adjusted under 35 U.S.C. 154(b) by 0 days.

(21) Appl. No.: 17/338,312

(22) Filed: Jun. 3, 2021

(65) Prior Publication Data
US 2022/0107355 A1    Apr. 7, 2022

(30) Foreign Application Priority Data
Oct. 7, 2020    (KR) .................. 10-2020-0129508

(51) Int. Cl.
*G01R 31/28* (2006.01)
*G01R 31/00* (2006.01)
*G01R 1/04* (2006.01)

(52) U.S. Cl.
CPC ....... *G01R 31/2831* (2013.01); *G01R 1/0408* (2013.01); *G01R 31/003* (2013.01)

(58) Field of Classification Search
CPC ...... G01R 31/28; G01R 31/2831; G01R 1/04; G01R 1/0408; G01R 31/00; G01R 31/003; G01R 31/2875; G01R 19/225; G01R 31/26; G01R 31/2601
See application file for complete search history.

(56) References Cited

U.S. PATENT DOCUMENTS

| | | | |
|---|---|---|---|
| 6,620,028 B2 * | 9/2003 | Yang | B28D 5/0058 451/6 |
| 8,920,544 B2 | 12/2014 | Menzel et al. | |
| 8,937,310 B2 | 1/2015 | Nakamura | |
| 10,481,177 B2 | 11/2019 | Ozawa et al. | |
| 2002/0011835 A1 * | 1/2002 | Yamazaki | G01R 31/2875 324/750.03 |

(Continued)

FOREIGN PATENT DOCUMENTS

| | | |
|---|---|---|
| CN | 102565680 A | 7/2012 |
| KR | 20060127689 A | 12/2006 |
| KR | 20070001301 A | 1/2007 |

(Continued)

*Primary Examiner* — Son T Le
(74) *Attorney, Agent, or Firm* — Myers Bigel, P.A.

(57) ABSTRACT

A substrate testing apparatus configured to perform a hot electron analysis (HEA) test for analyzing a stand-by failure in a substrate includes a heating chuck having a first surface configured to support the substrate and a second surface opposite to the first surface. The heating chuck is configured to heat the substrate and has an aperture passing through the first surface and the second surface. A substrate moving device moves the substrate on the heating chuck in a lateral direction. A camera is under the heating chuck and photographs the substrate, which is exposed by the heating chuck aperture.

20 Claims, 15 Drawing Sheets

(56) References Cited

U.S. PATENT DOCUMENTS

2005/0016818 A1* 1/2005 Ito .................. B05B 13/0228
　　　　　　　　　　　　　　　　　　　　414/936

FOREIGN PATENT DOCUMENTS

| KR | 100952522 B1 | 4/2010 |
| KR | 20130000375 A | 1/2013 |
| KR | 101447716 B1 * | 10/2014 |

* cited by examiner

SUBSTRATE TESTING APPARATUS

CROSS-REFERENCE TO RELATED APPLICATION

This application claims the benefit of Korean Patent Application No. 10-2020-0129508, filed on Oct. 7, 2020, in the Korean Intellectual Property Office, the disclosure of which is incorporated herein in its entirety by reference.

BACKGROUND

The inventive concept relates to a substrate testing apparatus, and more particularly, to a substrate testing apparatus for detecting failures in a semiconductor substrate.

After a semiconductor substrate is manufactured, a process of testing for failures in the semiconductor substrate may be performed. For example, a hot electron analysis (HEA) test for testing a stand-by failure in the semiconductor substrate may be performed. During the HEA test, a substrate testing apparatus may apply a voltage to a portion of the semiconductor substrate, photograph photons or heat emitted by the semiconductor substrate via a camera, and then determine whether there is a stand-by failure in the semiconductor substrate.

SUMMARY

The inventive concept provides a substrate testing apparatus capable of precisely detecting a stand-by failure in a substrate.

According to an aspect of the inventive concept, there is provided a substrate testing apparatus configured to perform a hot electron analysis (HEA) test for analyzing a stand-by failure in a substrate includes a heating chuck having a first surface configured to support the substrate and a second surface opposite to the first surface. The heating chuck is configured to heat the substrate and has an aperture that extends through the first surface and the second surface. A substrate moving device moves the substrate on the heating chuck in a lateral direction. A camera is under the heating chuck and photographs the substrate, which is exposed through the heating chuck aperture.

According to another aspect of the inventive concept, there is provided a substrate testing apparatus configured to perform an HEA test for analyzing a stand-by failure in a substrate. The substrate testing apparatus includes a support plate having a mounting opening, a heating chuck inside the mounting opening of the support plate. The heating chuck has a first surface configured to support the substrate and a second surface opposite to the first surface. The heating chuck has an aperture that extends through the first surface and the second surface in a vertical direction. The heating chuck heats the substrate. A substrate moving device surrounds a peripheral edge of the substrate and moves the substrate on the support plate and the heating chuck in a lateral direction. A camera is under the heating chuck and photographs a test portion of the substrate, which is exposed through the heating chuck aperture. A probe device is over the heating chuck and applies a voltage to the test portion of the substrate.

According to another aspect of the inventive concept, there is provided a substrate testing apparatus configured to perform an HEA test for analyzing a stand-by failure in a substrate. The substrate testing apparatus includes a chamber having a process space, and a housing in the process space of the chamber. The housing has an upper surface with an opening therein. A heating chuck has a first surface configured to support the substrate and a second surface opposite to the first surface. The heating chuck has an aperture that extends through the first surface and the second surface in a vertical direction. The heating chuck is on the upper surface of the housing such that a portion of a lower surface of the heating chuck is exposed by the housing opening. The heating chuck heats the substrate. A substrate moving device surrounds a peripheral edge of the substrate and moves the substrate on the heating chuck in a lateral direction. A camera is in an inner space of the housing under the heating chuck and photographs a test portion of the substrate, which is exposed through the heating chuck aperture. A probe device is in the process space of the chamber over the heating chuck and applies a voltage to the test portion of the substrate.

A substrate testing apparatus according to the inventive concept may heat a substrate by using a heating chuck during an HEA test. Accordingly, the intensities of photon emission and thermal emission in a defective portion of a substrate may be increased, and the substrate testing apparatus according to the inventive concept may precisely detect a stand-by failure in the substrate by using a camera.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Example embodiments will now be described more fully with reference to the accompanying drawings in which some example embodiments are shown.

Figure 1:
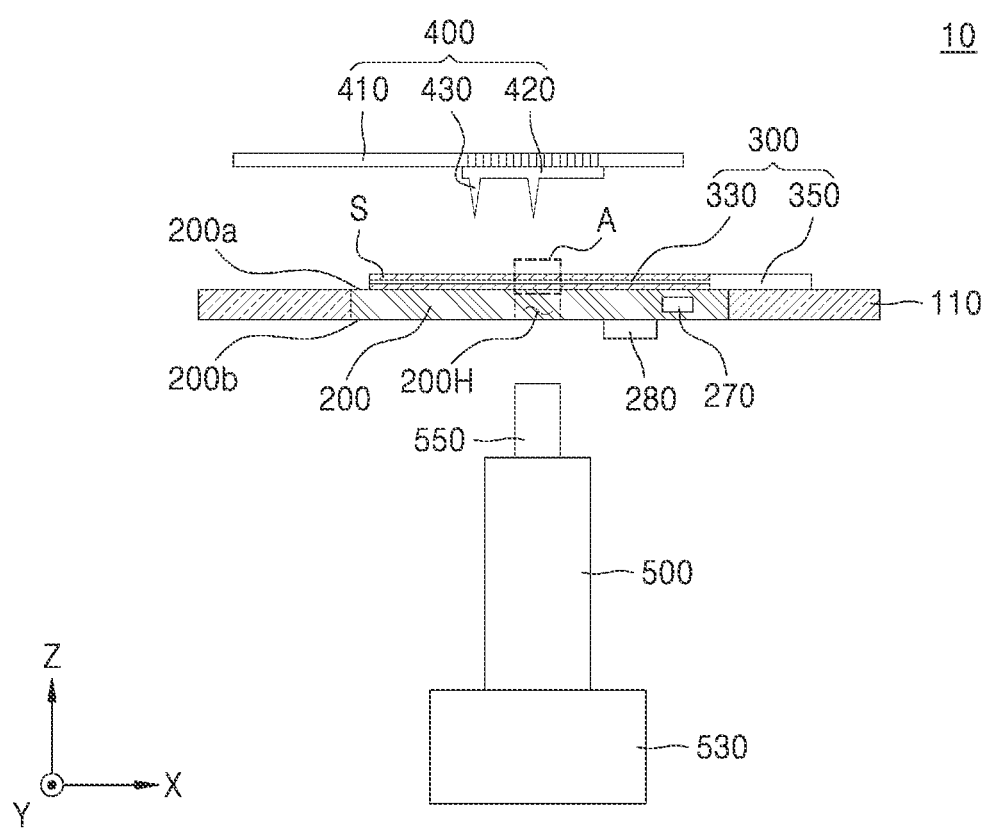
FIG. 1 is a cross-sectional view of a substrate testing apparatus according to an example embodiment.
Figure 2:
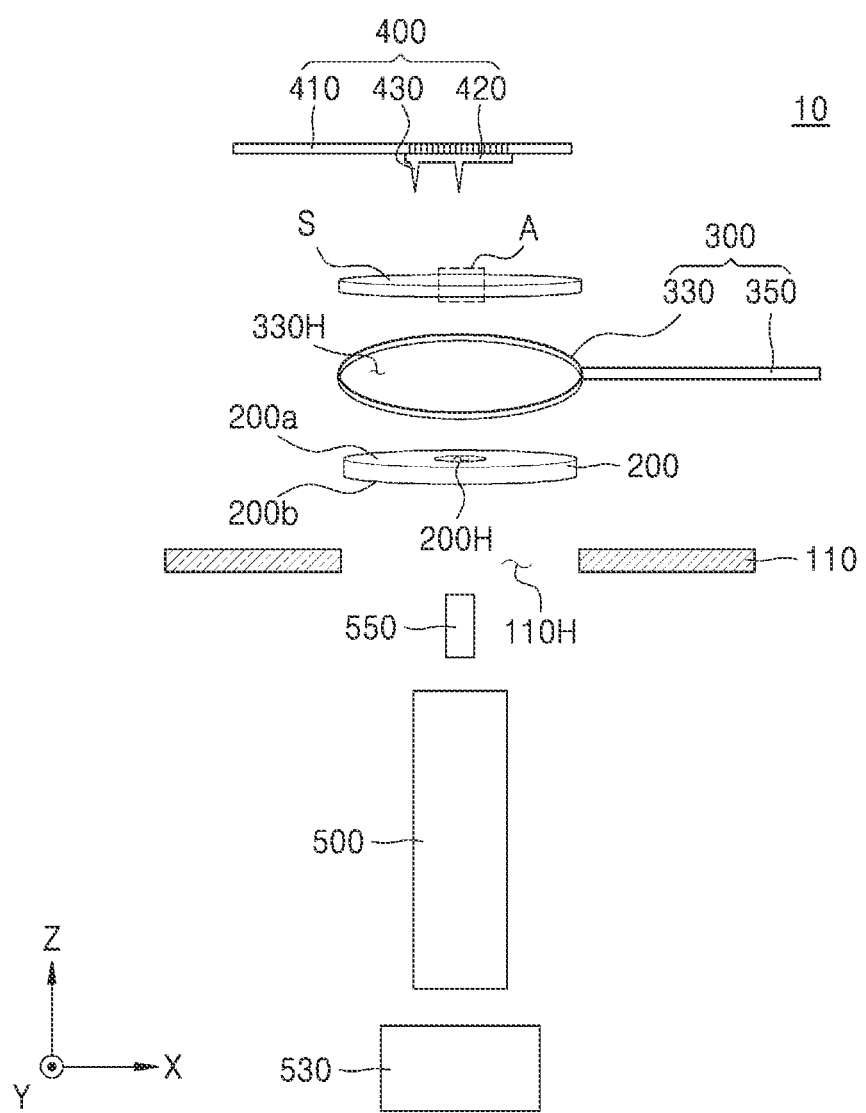
FIG. 2 is an exploded view of a substrate testing apparatus according to an example embodiment.

FIG. 1 is a cross-sectional view of a substrate testing apparatus 10 according to an example embodiment. FIG. 2 is an exploded view of the substrate testing apparatus 10 according to an example embodiment.

The substrate testing apparatus 10 according to the example embodiment may be an apparatus for testing a failure in a substrate S. More specifically, the substrate testing apparatus 10 may be an apparatus configured to perform a hot electron analysis (HEA) test for testing a stand-by failure in the substrate S.

The stand-by failure in the substrate S may refer to various kinds of failures that occur in a stand-by state of the substrate S. For example, the stand-by failure in the substrate S may include a leakage current that occurs in a PN junction or an oxide film in the stand-by state of the substrate S.

In an example embodiment, the HEA test may include applying a voltage to a test portion A of the substrate S, photographing photon emission and/or thermal emission, which occurs in the test portion A of the substrate S, by using a camera, and then determining whether there is a failure in the test portion A of the substrate S.

In addition, the substrate testing apparatus 10 may utilize an image related to the photon emission and/or the thermal emission, which is photographed in the test portion A of the substrate S, and determine whether there is a stand-by failure (e.g., a leakage current) in the test portion A of the substrate S.

The substrate S that is tested by the substrate testing apparatus 10 may be a semiconductor substrate. For example, the substrate S may be a wafer having circuit patterns including a plurality of layers.

Referring to FIGS. 1 and 2, the substrate testing apparatus 10 according to an example embodiment may include a support plate 110, a heating chuck 200, a temperature sensor 280, a substrate moving device 300, a probe device 400, a camera 500, a camera driving device 530, and a lens 550.

The support plate 110 may have a mounting opening 110H configured to contain the heating chuck 200 in a central portion thereof. An upper portion of the support plate 110 may support a portion of the substrate S. For example, when the substrate S is moved by the substrate moving device 300 on the upper surface of the support plate 110 in a lateral direction, the upper surface of the support plate 110 may support a portion of the substrate S.

The heating chuck 200 may be inside the mounting opening 110H of the support plate 110 and support the substrate S. Also, the heating chuck 200 may heat the substrate S mounted on the heating chuck 200 when the HEA test is performed.

In an example embodiment, the heating chuck 200 may have a first surface 200a on which the substrate S is mounted and a second surface 200b that is opposite to the first surface 200b. Also, the heating chuck 200 may have a photographing aperture 200H, which passes through the first surface 200a and the second surface 200b of the heating chuck 200 in a vertical direction.

The photographing aperture 200H of the heating chuck 200 may be an opening configured to allow the substrate S to be photographed via camera 500. When the substrate S is mounted on the heating chuck 200, the test portion A of the substrate S, which overlaps the photographing aperture 200H in the vertical direction, may be exposed. Thus, the camera 500 may photograph the test portion A of the substrate S, which is exposed by the photographing aperture 200H.

When the heating chuck 200 is viewed from above, the photographing aperture 200H of the heating chuck 200 may have a tetragonal shape. For example, when the heating chuck 200 is viewed from above, the photographing aperture 200H of the heating chuck 200 may have a square shape having a horizontal length and a vertical length of about 5 cm, respectively. However, the horizontal length and the vertical length of the photographing aperture 200H of the heating chuck 200 are not limited to the above-described examples.

In an example embodiment, the heating chuck 200 may include an upper plate (refer to 210 in FIG. 4) having the first surface 200a, a lower plate (refer to 230 in FIG. 4), which is combined with the upper plate 210 and has the second surface 200b, and a heating element 270 configured to generate heat to heat the upper plate 210 and the lower plate 230. The upper plate 210, the lower plate 230, and the heating element 270 of the heating chuck 200 will be described in further detail with reference to FIGS. 5 to 7.

The temperature sensor 280 may measure a temperature of the heating chuck 200. In an example embodiment, the temperature sensor 280 may be adhered to a lower surface of the heating chuck 200 and measure a temperature of the heating chuck 200.

In an example embodiment, the temperature sensor 280 may include a contact-type temperature sensor configured to measure the temperature of the heating chuck 200 by contact with the heating chuck 200. For example, the temperature sensor 280 may include a thermocouple sensor, a thermistor sensor, and/or a resistance temperature detector (RTD) sensor.

However, the inventive concept is not limited thereto, and the temperature sensor 280 may include a noncontact-type temperature sensor, which is spaced apart from the heating chuck 200.

The substrate moving device 300 may move the substrate S on the support plate 110 and the heating chuck 200 in a lateral direction. The substrate moving device 300 may include a substrate fixing portion 330 configured to fix the substrate S and a substrate moving portion 350 configured to move the substrate S.

In an example embodiment, the substrate fixing portion 330 of the substrate moving device 300 may have a circular or ring shape configured to surround a peripheral edge of the substrate S. The substrate fixing portion 330 may have a ring shape with a substrate fixing opening 330H, and a sectional area of the substrate fixing opening 330H is greater than a sectional area of the substrate S. Thus, an inner surface of the substrate moving device 300 may surround the edge of the substrate S located inside the substrate fixing opening 330H.

In addition, when the substrate S is inside the substrate fixing opening 330H, the substrate S may be temporarily combined with the substrate fixing portion 330 by an adhesive member 510, such as an adhesive tape. That is, when the HEA test is performed, the substrate S may be combined with the substrate fixing portion 330 by the adhesive member (refer to 510 in FIG. 7). After the HEA test is performed, the substrate S may be separated from the substrate fixing portion 330 by removing the adhesive member 510.

In an example embodiment, the substrate moving portion 350 of the substrate moving device 300 may have a rod shape connected to an outer surface of the substrate fixing portion 330. One side of the substrate moving portion 350 may be connected to the substrate fixing portion 330, while another side of the substrate moving portion 350 may be connected to an actuator configured to move the substrate moving device 300. For example, the actuator may be a combination of a motor and a gear. The actuator may be a driving source configured to generate power to move the substrate moving device 300 on the support plate 110 and the heating chuck 200 in a lateral direction.

The probe device 400 may be positioned over the heating chuck 200 and may be a device configured to apply a voltage to a portion of the substrate to perform a stand-by failure test on the substrate S. The probe device 400 may include a pogo block 410, a probe card 420, and at least one probe pin 430.

The pogo block 410 of the probe device 400 may be a substrate on which circuit patterns are formed. For example, the pogo block 410 may include a printed circuit board (PCB) configured to connect a test head (not shown) to the probe card 420. POGO pins are well understood in the art and typically include a spring so as to absorb some of the impact of contact.

In an example embodiment, the pogo block 310 may receive an electric signal from the test head and transmit the electric signal to the probe card 420. For example, the pogo block 410 may include a plurality of pogo pins in contact with the probe card 420.

The pogo card 420 of the probe device 400 may transmit an electric signal transmitted from the pogo block 410 to the probe pin 430.

In addition, a probe pin 430 of the probe device 400 may be a pin in contact with the substrate S on the heating chuck 200. For example, the probe pin 430 may be a pogo-pin-type pin that elastically expands and contracts.

In an example embodiment, one side of the probe pin 430 may be connected to the probe card 420, and another side of the pogo pin 430 may be in contact with one portion of the substrate S. For example, the probe pin 430 may have a needle shape of which a diameter decreases in a downward direction.

Furthermore, the probe pin 430 may include a metal material to apply a voltage to a portion of the substrate S. For example, the probe pin 430 may include tungsten or platinum. However, a material of the probe pin 430 is not limited to the above-described examples.

The camera 500 may be positioned under the heating chuck 200 and is configured to photograph the test portion A of the substrate S, which is exposed by the photographing aperture 200H of the heating chuck 200. In an example embodiment, the camera 500 may photograph a lower surface of the test portion A of the substrate S or the inside of the substrate S, which overlaps the lower surface of the test portion A in the vertical direction.

As the number of pattern layers in the substrate S increases, detecting a defect in a first pattern layer located in a lower portion of the substrate S may be more difficult. For example, when the inside of the substrate S is photographed by a camera located above the substrate S, the first pattern layer of the substrate S may be covered by a plurality of pattern layers located on the first pattern layer. Thus, the defect in the first pattern layer of the substrate S may not be photographed by the camera.

The camera 500 according to an example embodiment may be under the heating chuck 200 and photograph the test portion A of the substrate S, which is exposed by the photographing aperture 200H of the heating chuck 200. Thus, the camera 500 may easily detect a defect in a pattern layer located in the lower portion of the substrate S.

In an example embodiment, the camera 500 may include a photon emission microscope (PHEMOS) device configured to photograph photon emission that occurs in the test portion A of the substrate S. For example, the PHEMOS device may photograph photon emission, which occurs in the test portion A of the substrate S to which a voltage is applied, and detect a leakage current, which occurs in a PN junction or an oxide film in the stand-by state of the substrate S.

In an example embodiment, the camera 500 may include a thermal emission microscope (THEMOS) device configured to photograph thermal emission, which occurs in the test portion A of the substrate S. For example, the THEMOS device may photograph heat generated by the test portion A of the substrate S to which a voltage is applied, and detect a short point, an abnormal resistance, or a contact failure in the stand-by state of the substrate S.

In an example embodiment, the camera 500 may include an indium-gallium-arsenic (InGaAs) camera including a compound semiconductor including indium (In), gallium (Ga), and arsenic (As) or an indium-antimony (InSb) camera including a compound semiconductor including indium and antimony (Sb).

For example, when the camera 500 includes the InGaAs camera, the camera 500 may capture an optical image, which is generated in the test portion A of the substrate S to which the voltage is applied. Also, when the camera 500 includes the InSb camera, the camera 500 may capture a thermal image, which is generated in the test portion A of the substrate S to which the voltage is applied.

In addition, the camera 500 is not limited to the above-described kinds of cameras and may include a high-performance camera, such as a charge-coupled device (CCD) camera and a motion capture technologies (MCT) camera.

The camera driving device 530 may be a device configured to move the camera 500 in at least one of the lateral direction and the vertical direction.

In an example embodiment, the camera driving device 530 may include a moving stage configured to drive the camera 500. For example, the camera driving device 530 may include an X stage configured to move the camera 500 in an X direction, a Y stage configured to move the camera 500 in a Y direction, and a Z stage configured to move the camera 500 in a Z direction. The X stage, the Y stage, and the Z stage of the camera driving device 530 may be connected to an actuator, such as a motor.

The lens 550 may be between the camera 500 and the heating chuck 200 and is configured to collect and focus a light. The lens 550 may collect or disperse light to adjust a focusing position on the substrate S for a photograph. For example, the lens 550 may be configured to refract light detected by the camera 500.

In an example embodiment, the camera 500 includes an InGaAs camera or an InSb camera, the lens 550 may include an infrared (IR) lens configured to refract light in an IR wavelength band.

In an example embodiment, the lens 550 may include a plurality of lenses 550 having different refractive indices. For example, one lens 550 may be selected from the plurality of lenses 550 to adjust a focusing position on the substrate S for a photograph.

Figure 3:
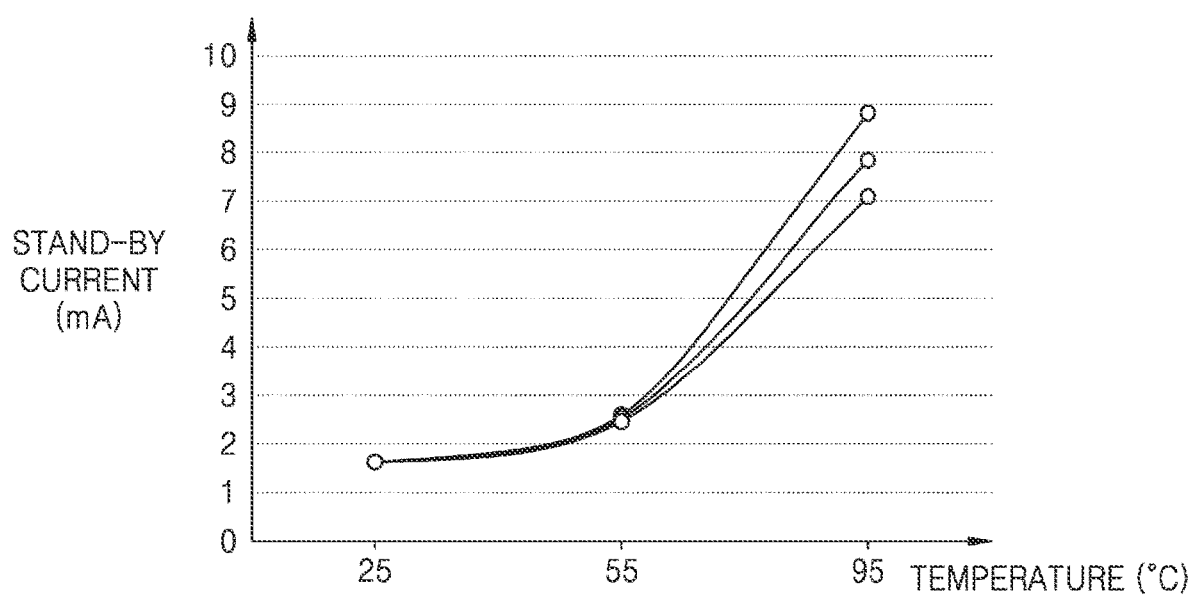
FIG. 3 is a graph showing experimental results of stand-by current caused in a test portion of a substrate with respect to temperature of the substrate.

FIG. 3 is a graph showing experimental results of stand-by current caused in a test portion A of a substrate S with respect to temperature of the substrate S. Specifically, FIG. 3 is a graph showing stand-by current caused in the test portion A of the substrate S with respect to temperature of the substrate S when a constant voltage is applied to the test portion A of the substrate S.

Referring to FIG. 3, when a voltage is applied to the test portion A of the substrate S, a stand-by current that occurs in the test portion A of the substrate may increase with a rise in temperature of the substrate S.

For example, when a voltage of about 1.2 V is applied to the test portion A of the substrate S that has a temperature of about 25° C., which is similar to room temperature, a stand-by current of about 1 mA to about 2 mA may occur in the test portion A of the substrate S.

In addition, when a voltage of about 1.2 V is applied to the test portion A of the substrate S that has a temperature of about 95° C., a stand-by current of about 7 mA to about 9 mA may occur in the test portion A of the substrate S.

When the test portion A of the substrate S has a temperature similar to room temperature, a stand-by current that occurs in the test portion A of the substrate S may be relatively small. In contrast, when the test portion A of the substrate S has a relatively high temperature (e.g., about 95° C.), a stand-by current that occurs in the test portion A of the substrate S may be relatively large.

That is, as a temperature of the test portion A of the substrate increases, leakage currents of electrical components (e.g., transistors) formed in the test portion A of the substrate S may be increased, and a stand-by current may be increased in the test portion A of the substrate S.

Accordingly, when the test portion A of the substrate S has a relatively high temperature, it may be easy to detect a failure in the test portion A of the substrate S based on the stand-by current.

In addition, when a voltage is applied to the test portion A of the substrate S, photon emission and thermal emission in the test portion A of the substrate S may increase with a rise in the temperature of the substrate S.

When the test portion A of the substrate S has a temperature similar to room temperature, the intensity of photon emission and/or thermal emission, which occurs in the test portion A of the substrate S, may be relatively low. In contrast, when the test portion A of the substrate S has a relatively high temperature of, for example, about 95° C., the intensity of photon emission and/or thermal emission, which occurs in the test portion A of the substrate S, may be relatively high.

That is, as the temperature of the test portion A of the substrate S increases, the intensity of photon emission and/or thermal emission in a defective portion of the test portion A of the substrate S may be increased.

Accordingly, when the test portion A of the substrate S has a relatively high temperature, it may be easy to detect a defect in the test portion A of the substrate S based on the intensity of photon emission and/or thermal emission.

The substrate testing apparatus 10 according to an example embodiment may heat the substrate S by using a heating chuck 200 during an HEA test. In an example embodiment, the heating chuck 200 of the substrate testing apparatus 10 may be heated to a temperature of about 25° C. to about 150° C. by a heating element 270. Also, the substrate S on the heating chuck 200 may also be heated to a temperature of about 25° C. to about 150° C. due to heat conduction.

When the substrate testing apparatus 10 heats the substrate S by using the heating chuck 200, the intensity of photon emission and/or thermal emission may be increased at a portion of the test portion A of the substrate S, in which a failure occurs. Accordingly, the substrate testing apparatus 10 may precisely detect a stand-by failure in the test portion A of the substrate S by using the camera 500.

Figure 4:
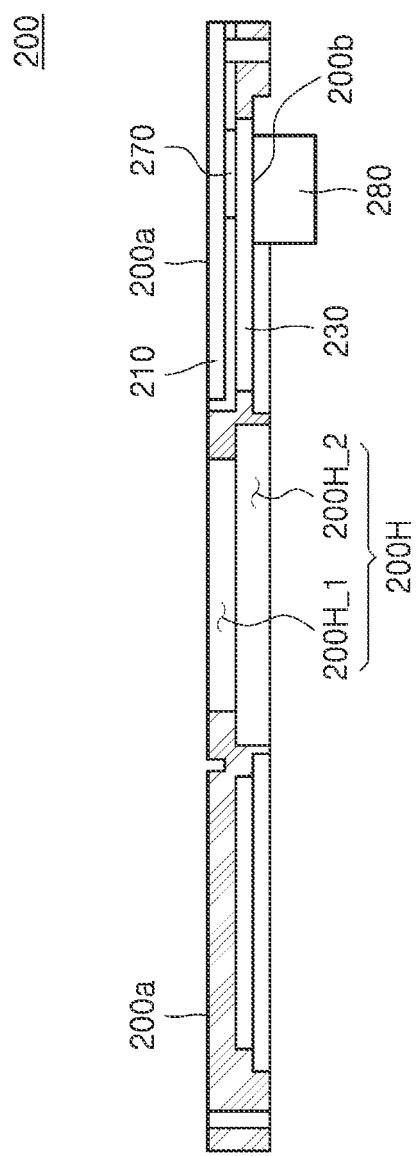
FIG. 4 is a cross-sectional view of a heating chuck of a substrate testing apparatus, according to an example embodiment.
Figure 5:
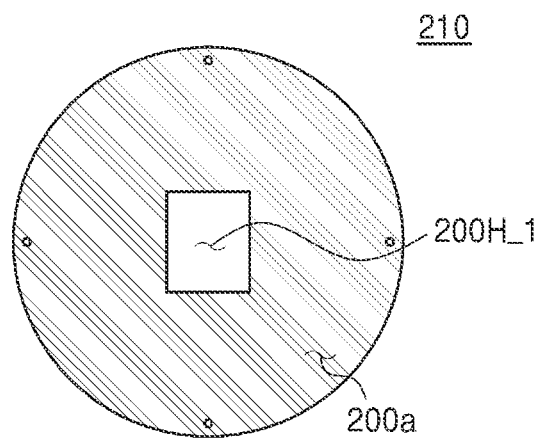
FIG. 5 is a plan view of an upper plate of a heating chuck.
Figure 6A:
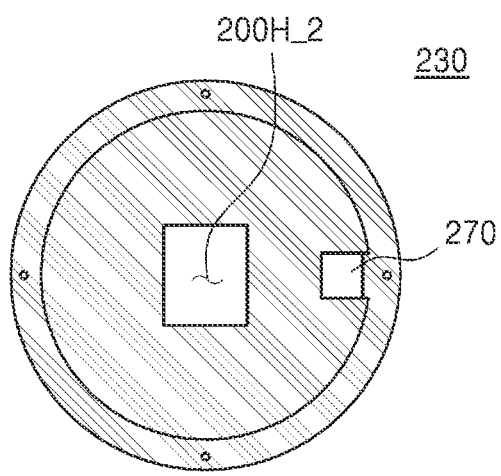
FIG. 6A is a plan view of a lower plate of a heating chuck.
Figure 6B:
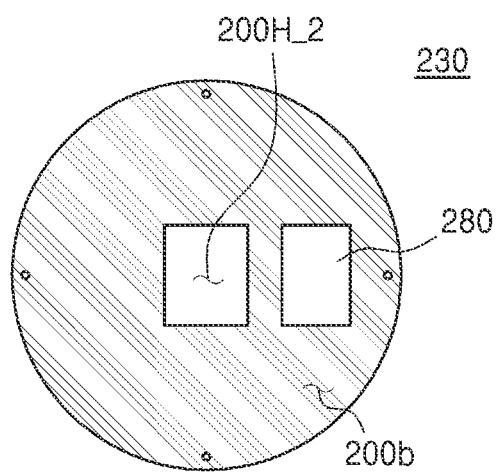
FIG. 6B is a bottom view of a lower plate of a heating chuck.

FIG. 4 is a cross-sectional view of a heating chuck 200 of a substrate testing apparatus 10, according to an example embodiment. FIG. 5 is a plan view of an upper plate 210 of the heating chuck 200. FIG. 6A is a plan view of a lower plate 230 of the heating chuck 200, and FIG. 6B is a bottom view of the lower plate 230 of the heating chuck 200.

Referring to FIGS. 4 to 6B, the heating chuck 200 may include an upper plate 210, a lower plate 230, and a heating element 270.

In an example embodiment, the upper plate 210 of the heating chuck 200 may have a first surface 200a in which a first photographing aperture 200H_1 is formed. The first surface 200a of the upper plate 210 may be an upper surface of the heating chuck 200 and may be a surface on which a substrate S is mounted. For example, the upper plate 210 may have a disc shape.

In an example embodiment, the lower plate 230 of the heating chuck 200 may have a second surface 200b in which a second photographing aperture 200H_2 is formed. The second surface 200b of the lower plate 230 may be a surface opposite to the first surface 200a of the upper plate 210 and a lower surface of the heating chuck 200. For example, the lower plate 230 may have a disc shape.

In an example embodiment, the upper plate 210 and the lower plate 230 may be combined with each other. Also, when the upper plate 210 is combined with the lower plate 230, the first photographing aperture 200H_1 of the upper plate 210 may overlap the second photographing aperture 200H_2 of the lower plate 230 in a vertical direction, as illustrated in FIG. 4.

In other words, the first photographing aperture 200H_1 of the upper late 210 and the second photographing aperture 200H_2 of the lower plate 230 may constitute a photographing aperture 200H of the heating chuck 200.

In an example embodiment, the upper plate 210 and the lower plate 230 may include a highly thermally conductive material. For example, the upper plate 210 and the lower plate 230 may include a metal material, such as aluminum (Al).

The heating element 270 may be on the lower plate 230 and heat the lower plate 230 and the upper plate 210. In an example embodiment, the heating element 270 may be between the lower plate 230 and the upper plate 210.

For example, a lower surface of the heating element 270 may be in contact with the lower plate 230, and an upper surface of the heating element 270 may be in contact with the upper plate 210. However, the inventive concept is not limited thereto. The lower surface of the heating element 270 may be in contact with the lower plate 230, and the upper surface of the heating element 270 may be apart from the upper plate 210.

In an example embodiment, the heating element 270 may be a ceramic heater. More specifically, the heating element 270 may be a ceramic heater configured to receive power from an external electrode and generate heat. The ceramic heater may include a ceramic plate configured to form an outer appearance of the ceramic heater and a heating body having a predetermined resistance. The heating body may be embedded in the ceramic plate and generate heat due to current.

In an example embodiment, the heating element 270 may include one ceramic heater. When the heating element 270 includes one ceramic heater, the ceramic heater may be at an edge of the lower plate 230.

In an example embodiment, the heating element 270 may include a plurality of ceramic heaters. When the heating element 270 includes the plurality of ceramic heaters, the ceramic heaters may be at the edge of the lower plate 230 and arranged to be symmetrical with respect to the second photographing aperture 200H_2 of the lower plate 230.

In an example embodiment, a temperature sensor 280 may be adhered to a lower surface of the lower plate 230. However, the inventive concept is not limited thereto, and the temperature sensor 280 may be adhered to the upper plate 210. The temperature sensor 280 may measure a temperature of the lower plate 230 in real-time.

Figure 7:
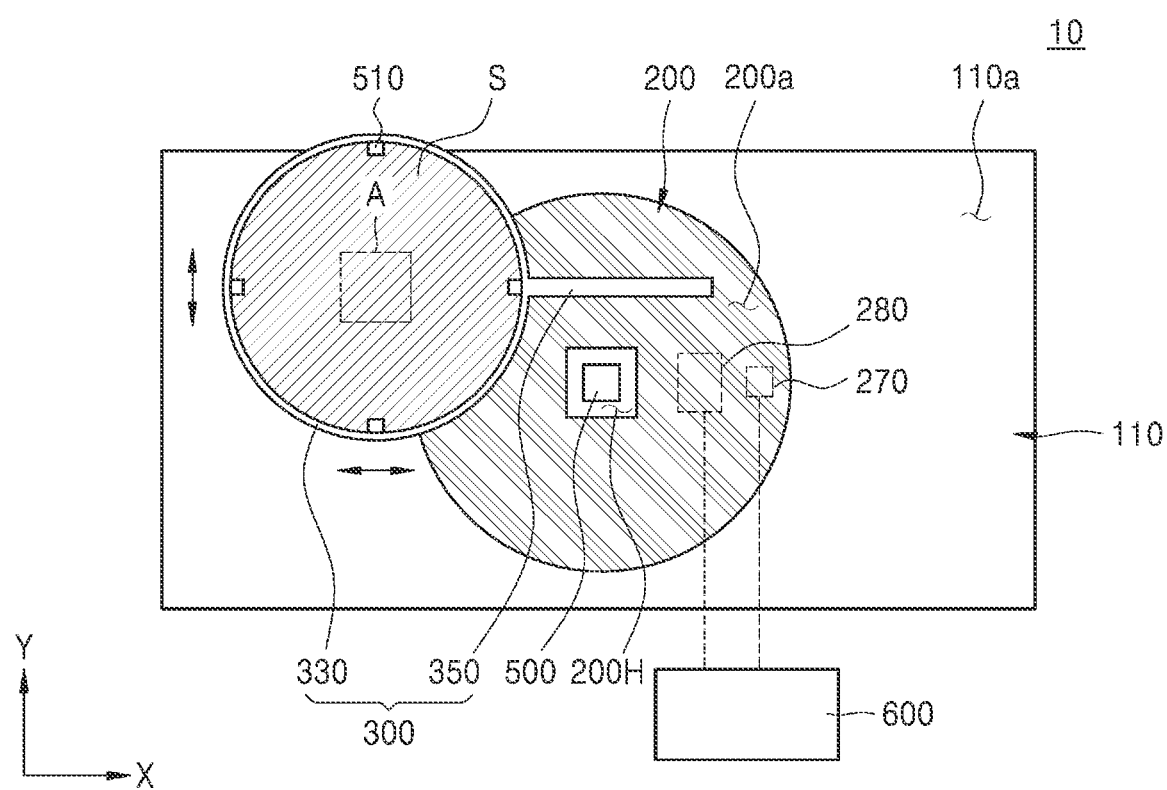
FIG. 7 is a plan view of a substrate testing apparatus according to an example embodiment.

FIG. 7 is a plan view of a substrate testing apparatus 10 according to an example embodiment.

Referring to FIG. 7, when the substrate testing apparatus 10 is viewed from above, a support plate 110 may surround a peripheral edge of a heating chuck 200, as illustrated. Also, an upper surface 110a of the support plate 110 may be coplanar with an upper surface 200a of the heating chuck 200.

Thus, when the substrate S is moved in a lateral direction on the upper surface 100a of the support plate 110 and the upper surface 200a of the heating chuck 200, damage to the substrate S may be prevented, and the substrate S may be supported by the support plate 110 and the heating chuck 200.

In an example embodiment, a substrate moving device 300 may move the substrate S in the lateral direction on the upper surface 100a of the support plate 110 and the upper surface 200a of the heating chuck 200. For example, the substrate moving device 300 may move the substrate S in the lateral direction such that a test portion A of the substrate S overlaps a photographing aperture 200H of the heating chuck 200 in a vertical direction.

In an example embodiment, when the substrate testing apparatus 10 is viewed from above, the photographing aperture 200H of the heating chuck 200, the lens 550, and a camera 500 may overlap in the vertical direction. Thus, the camera 500 may photograph a portion of the substrate S, which is exposed by the photographing aperture 200H of the heating chuck 200.

In an example embodiment, the substrate testing apparatus 10 may further include a controller 600, which is connected to a heating element 270 and a temperature sensor 280 of the heating chuck 200.

The controller 600 may control a temperature of the heating chuck 200. For example, the controller 600 may analyze a temperature of the heating chuck 200, which is measured by the temperature sensor 280, in real-time. Also, the controller 600 may indirectly analyze a temperature of the substrate S by referring to the temperature of the heating chuck 200, which is measured by the temperature sensor 280.

In an example embodiment, the controller 600 may control the temperature of the heating chuck 200 in real-time by referring to a temperature value of the heating chuck 200, which is measured by the temperature sensor 280. For example, the controller 600 may control the heating element 270 to heat the heating chuck 200 to a temperature of about 25° C. to about 150° C.

In an example embodiment, the controller 600 may control the heating element 270 such that the substrate S mounted on the heating chuck 200 is heated to a temperature of about 55° C. to about 95° C.

When the substrate S is heated to a temperature lower than about 95° C. during an HEA test, the intensity of photon emission and/or thermal emission that occurs in the test portion A of the substrate S may be relatively reduced. Referring to the graph of FIG. 3, when the temperature of the substrate S is below about 55° C., a stand-by current may be relatively low in the test portion A of the substrate S. Also, referring to the graph of FIG. 3, a slope of stand-by current in the test portion A of the substrate S may sharply change when the temperature of the substrate S is about 55° C.

When the substrate S is heated to a temperature higher than about 95° C. during the HEA test, the intensity of photon emission and/or thermal emission may be relatively increased in the entire region of the test portion A of the substrate S. Accordingly, in operation S1400 (FIG. 12), noise of images of photon emission and/or thermal emission, which are captured by the camera 500, may increase.

In addition, the controller 600 may control the heating element 270 such that the substrate S mounted on the heating chuck 200 is heated to a temperature of about 70° C. to about 95° C. Because the temperature of the substrate S is controlled by the controller 600 to be in a range of about 70° C. to about 95° C., photon emission and/or thermal emission in the test portion A of the substrate S may be increased, and thus, defects in the test portion A may be easily detected. Also, noise of images of photon emission and/or thermal emission, which are captured by the camera 500 of the substrate testing apparatus 10, may also be reduced.

Figure 8:
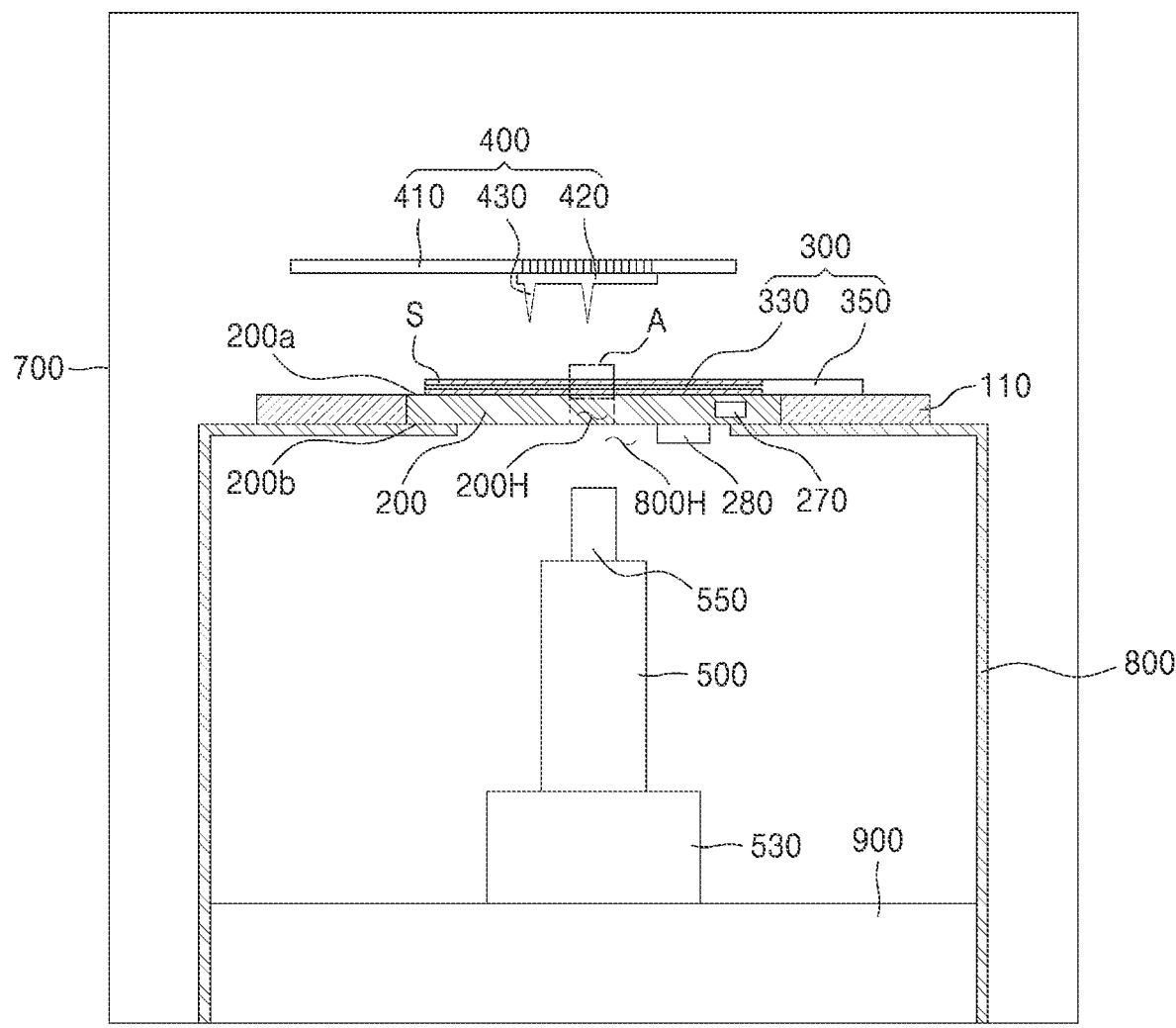
FIG. 8 is a cross-sectional view of a substrate testing apparatus according to an example embodiment.
Figure 9:
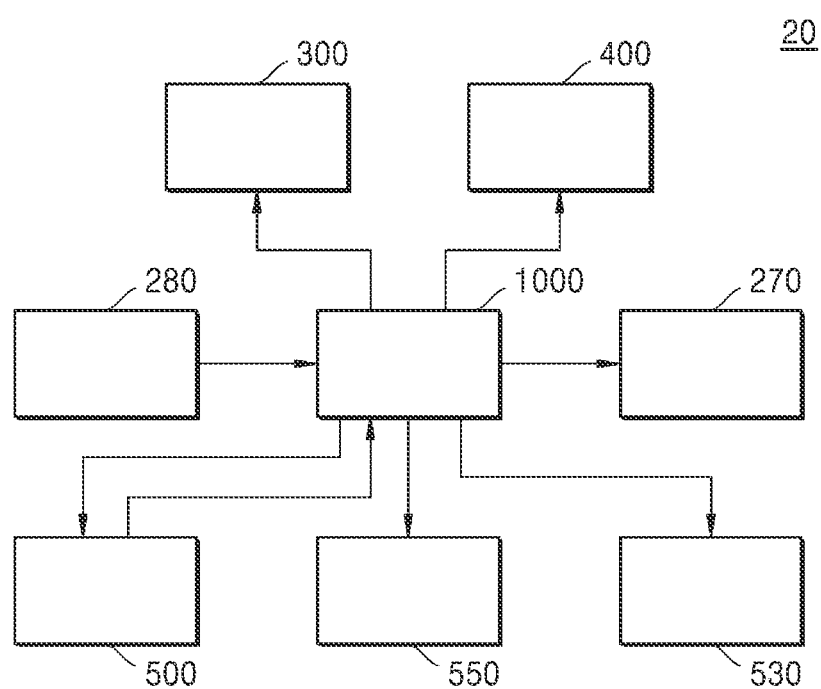
FIG. 9 is a signal flow diagram of a substrate testing apparatus according to an example embodiment.

FIG. 8 is a cross-sectional view of a substrate testing apparatus 20 according to an example embodiment. FIG. 9 is a signal flow diagram of the substrate testing apparatus 20 of FIG. 8, according to an example embodiment.

Referring to FIGS. 8 and 9, the substrate testing apparatus 20 according to an example embodiment may include a chamber 700, a housing 800, a support plate 110, a heating chuck 200, a temperature sensor 280, a substrate moving device 300, a probe device 400, a camera 500, a camera driving device 530, a lens 550, a dustproof device 900, and a controller 1000.

The chamber 700 may provide a process space in which an HEA test is performed using the substrate testing apparatus 20. In an example embodiment, respective operations of the HEA test may be all performed in the process space of the chamber 700. For example, an operation of heating a substrate S, an operation of applying a voltage to the substrate S, and an operation of photographing a test portion of the substrate S may be all performed in the process space of the chamber 700.

The support plate 110, the heating chuck 200, the temperature sensor 280, the substrate moving device 300, the probe device 400, the camera 500, the camera driving device 530, and the lens 550, which are included in the substrate testing apparatus 20, are the same as those described with reference to FIGS. 1 to 7, and thus, detailed descriptions thereof will be omitted.

The housing 800 may be in the process space of the chamber 700. The housing 800 may have an inner space, which is defined by an upper surface, a side surface, and a lower surface of the housing 800. The upper surface of the housing 800 may include an opening 800H that exposes at least a portion of the heating chuck 200 mounted on the upper surface of the housing 800.

In an example embodiment, the housing 800 may move in an inner space of the chamber 700. For example, the housing 800 may move in the inner space of the chamber 700 by using a transfer member, such as a wheel adhered to the lower surface of the housing 800. However, the inventive concept is not limited thereto, and the housing 800 may be fixed to the inner space of the chamber 700.

In an example embodiment, the camera 500, the camera driving device 530, the lens 550, and the dustproof device 900 may be in the inner space of the housing 800. In addition, the support plate 110 and the heating chuck 200 may be on the upper surface of the housing 800.

The dustproof device 900 may prevent vibration of the camera 500, the camera driving device 530, and the lens 550. The dustproof device 900 may reduce the vibration of the camera 500, the camera driving device 530, and the lens 550 due to external shocks applied to the housing 800. For example, the dustproof device 900 may include at least one of a spring, dustproof rubber, and a hydraulic cylinder.

The controller 1000 may be connected to the heating chuck 200, the temperature sensor 280, the substrate moving device 300, the probe device 400, the camera 500, the camera driving device 530, and the lens 550.

In an example embodiment, the controller 1000 may control the substrate moving device 300 to move the substrate S on the support plate 110 and the heating chuck 200. For example, to test a first test portion A1 of the substrate S, the controller 1000 may control the substrate moving device 300 such that the first test portion A1 overlaps a photographing aperture 200H of the heating chuck 200.

Furthermore, to test a second test portion A2, which is different from the first test portion A1 of the substrate S, the controller 1000 may control the substrate moving device 300 such that the second test portion A2 overlaps the photographing aperture 200H of the heating chuck 200.

In an example embodiment, the controller 1000 may control the intensity of a voltage applied to a test portion A of the substrate S by controlling the probe device 400. Also, the controller 1000 may control all operations of capturing images related to photon emission and thermal emission by controlling the camera 500, the camera driving device 530, and the lens 550.

The substrate testing apparatus 20 according to an example embodiment may include both the probe device 400 and the heating chuck 200. The probe device 400 may be in the process space of the chamber 700 and apply a voltage to the substrate S. The heating chuck 200 may be in the process space of the chamber 700 and heat the substrate S.

In other words, the substrate testing apparatus 20 may test the substrate S while heating the substrate S in the process space of the chamber 700. Accordingly, the substrate testing apparatus 20 may precisely detect a stand-by failure in the substrate S.

Figure 10:
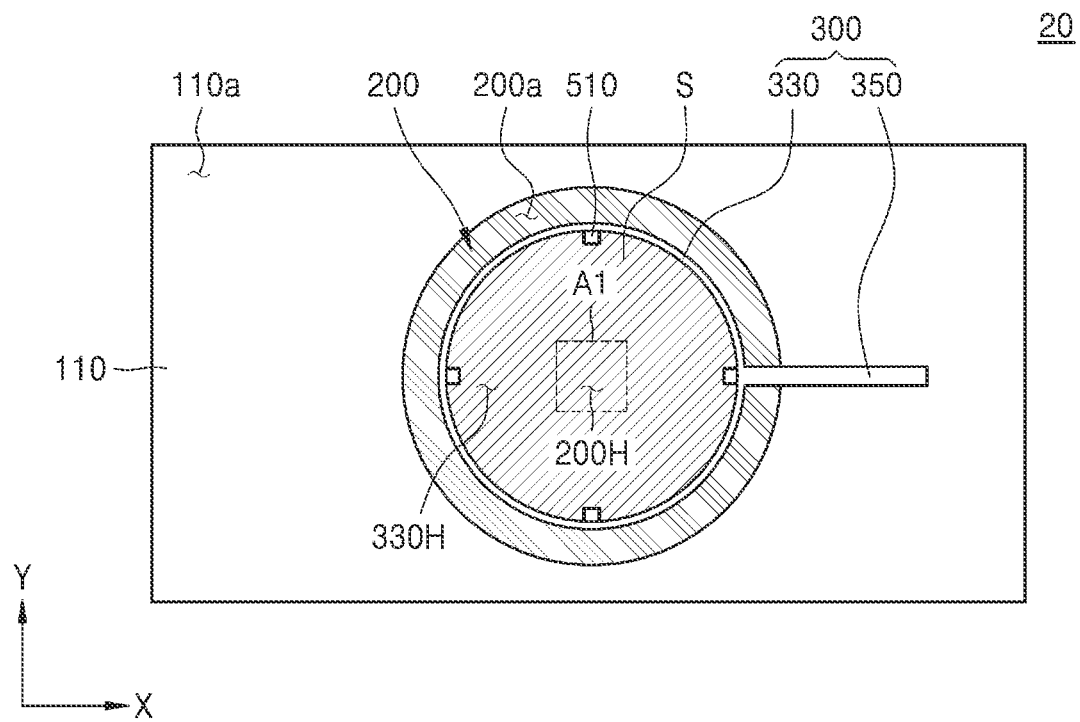
FIG. 10 is a plan view of a substrate testing apparatus in a first hot electron analysis (HEA) test state, according to an example embodiment.
Figure 11:
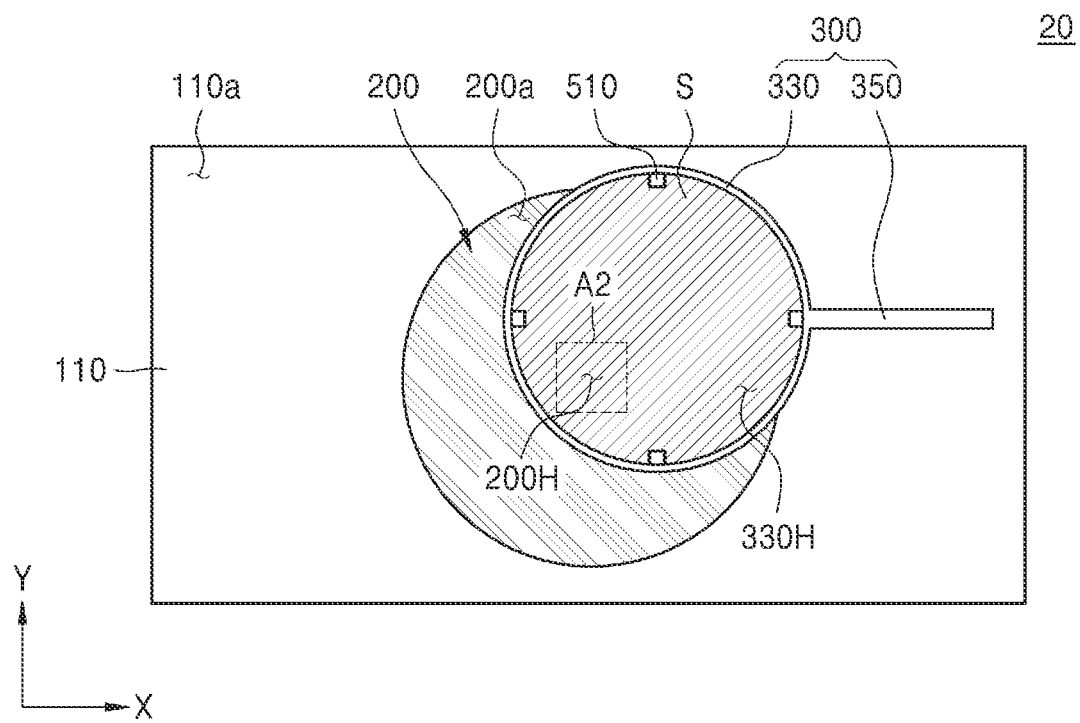
FIG. 11 is a plan view of a substrate testing apparatus in a second HEA test state, according to an example embodiment.

FIG. 10 is a plan view of a substrate testing apparatus 20 in a first HEA test state, according to an example embodiment. FIG. 11 is a plan view of the substrate testing apparatus 20 in a second HEA test state, according to an example embodiment.

Referring to FIGS. 10 and 11, a substrate fixing portion 330 of a substrate moving device 300 may surround a peripheral edge of a substrate S. That is, the substrate S may be inside a substrate fixing opening 330H of the substrate fixing portion 330 and fixed to the substrate fixing portion 330 by an adhesive material, such as an adhesive tape.

In addition, a substrate moving portion 350 of the substrate moving device 300 may move the substrate S on a support plate 110 and a heating chuck 200 in a lateral direction.

Referring to FIG. 10, the first HEA test state may be a state in which the substrate S is on the heating chuck 200 such that a first test portion A1 of the substrate S overlaps a photographing aperture 200H of the heating chuck 200 in a vertical direction to perform an HEA test on the first test portion A of the substrate S.

For example, the first test portion A1 may be a central portion of the substrate S. In the first HEA test state, all portions of a lower surface of the substrate S may be supported by the heating chuck 200.

Referring to FIG. 11, the second HEA test state may be a state in which the substrate S is on the heating chuck 200 and the support plate 110 such that a second test portion A2 of the substrate S overlaps the photographing aperture 200H of the heating chuck 200 in the vertical direction to perform an HEA test on the second test portion A2 of the substrate S. Here, the second test portion A2 of the substrate S may be apart from the first test portion A1 thereof.

For example, the second test portion A2 may be an edge portion of the substrate S. In the second HEA test state, a portion of the lower surface of the substrate S may be supported by the support plate 110, while another portion thereof may be supported by the heating chuck 200.

In an example embodiment, a second HEA test may be performed after a first HEA test. In other words, to perform the first HEA test, the substrate moving device 300 may move the substrate S on the heating chuck 200 such that the first test portion A1 of the substrate S overlaps the photographing aperture 200H of the heating chuck 200 in the vertical direction. In addition, after the first HEA test is performed, to perform the second HEA test, the substrate moving device 300 may move the substrate S on the heating chuck 200 such that the second test portion A2 of the substrate S overlaps the photographing aperture 200H of the heating chuck 200 in the vertical direction.

Figure 12:
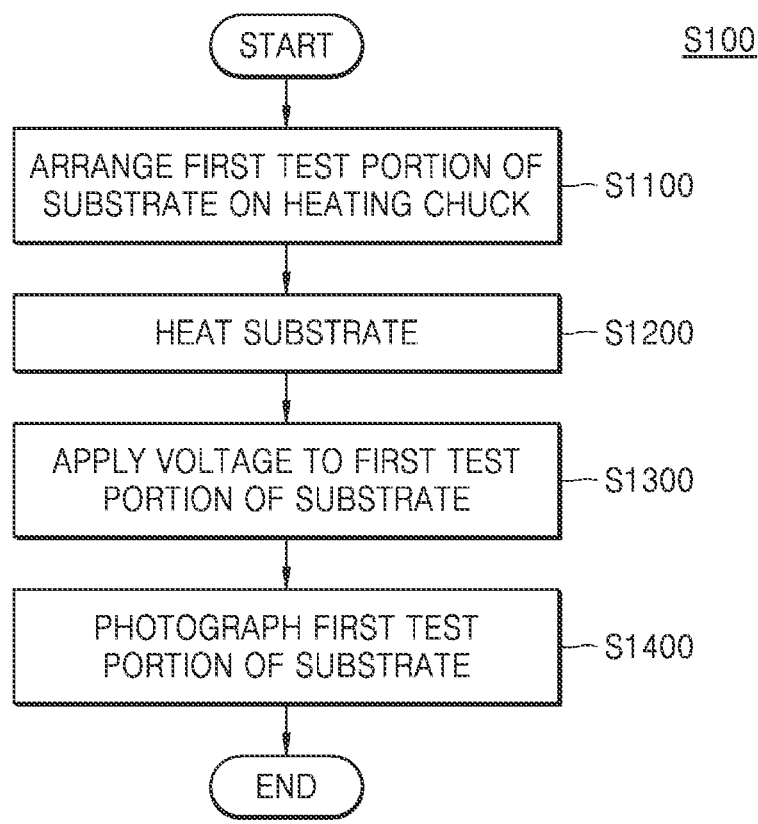
FIG. 12 is a flowchart of a substrate testing method according to an example embodiment.

FIG. 12 is a flowchart of a substrate testing method S100 according to an example embodiment. FIGS. 13 to 17 are diagrams showing respective operations of a substrate testing method S100 according to an example embodiment. The substrate testing method S100 according to the example embodiment may be a method of testing a stand-by failure in a substrate S.

Referring to FIG. 12, the substrate testing method S100 according to the example embodiment may include arranging a first test portion A1 of the substrate S on a heating chuck 200 (S1100), heating the substrate S (S1200), applying a voltage to the first test portion A1 of the substrate S (S1300), and photographing the first test portion A1 of the substrate S (S1400).

In addition, after operation S1400 of photographing the first test portion A1 of the substrate S, the substrate testing method S100 may further include arranging a second test portion A2 of the substrate S (refer to S2100 in FIG. 17), applying a voltage to the second test portion A2 of the substrate S, and photographing the second test portion A2 of the substrate S.

Figure 13:
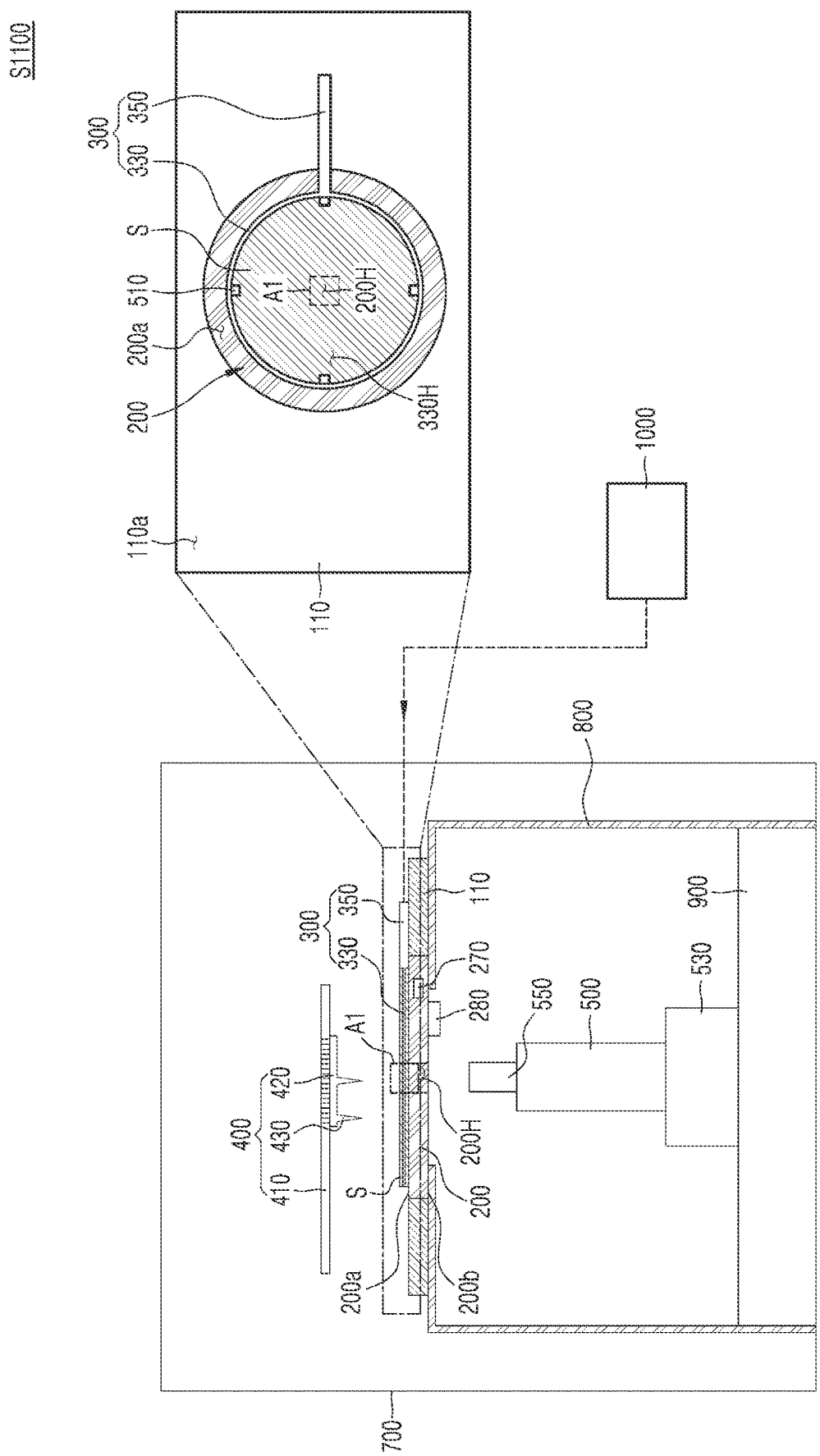
FIGS. 13 to 17 are diagrams of respective operations of a substrate testing method according to an example embodiment.

Referring to FIGS. 12 and 13, the substrate testing method S100 according to the example embodiment may include arranging the first test portion A1 of the substrate S on the heating chuck 200 (S1100).

Before operation S1100, the substrate S may be inside a substrate fixing opening 330H of a substrate fixing portion 330 of a substrate moving device 300. Also, the substrate S may be fixed to the substrate fixing portion 330 by an adhesive material, such as an adhesive tape.

In operation S1100, a controller 1000 may control the substrate moving device 300 such that the first test portion A1 of the substrate S overlaps a photographing aperture 200H of the heating chuck 200 in a vertical direction. Thus, the substrate S may be moved in a lateral direction on the heating chuck 200.

Figure 14:
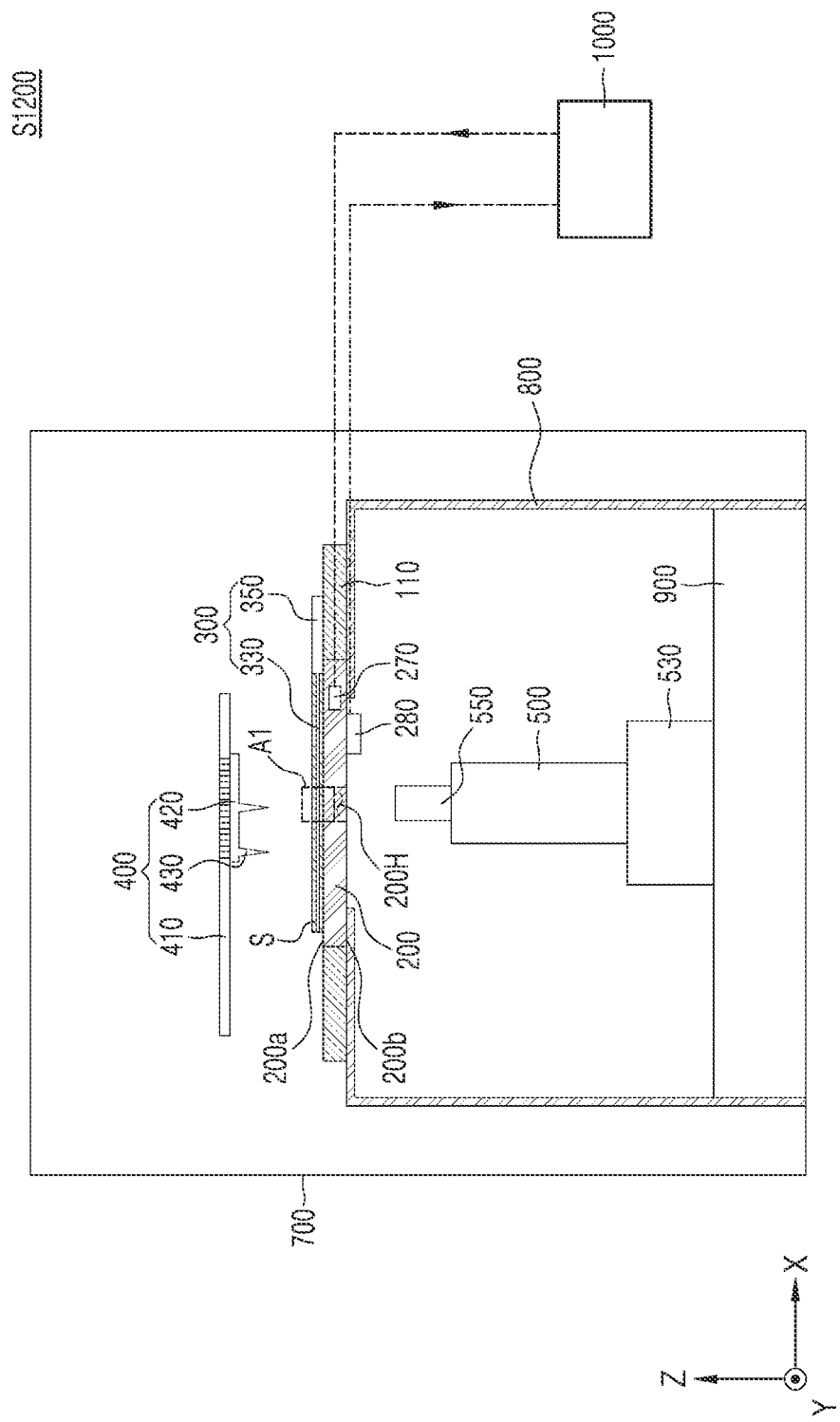

Referring to FIGS. 12 and 14, the substrate testing method S100 according to the example embodiment may include heating the substrate S (operation S1200).

In operation S1200, a heating element 270 of the heating chuck 200 may heat an upper plate 210 and a lower plate 230 of the heating chuck 200. Also, the substrate S mounted on the upper plate 210 of the heating chuck 200 may be heated by heat conduction.

In an example embodiment, in operation S1200, the controller 1000 may receive a signal about a temperature of the heating chuck 200, which is sensed by a temperature sensor 280, in real-time. Also, the controller 1000 may control the heating element 270 in real-time based on the signal received from the temperature sensor 280.

For example, in operation S1200, the controller 1000 may sense a surface temperature of the heating chuck 200 in real-time based on the signal received from the temperature sensor 280. In addition, the controller 1000 may indirectly sense a temperature of the substrate S on the heating chuck 200 based on the signal received from the temperature sensor 280.

In an example embodiment, in operation S1200, based on the signal received from the temperature sensor 280, the controller 1000 may control the heating element 270 such that a surface of the heating chuck 200 is maintained at a specific temperature.

However, the inventive concept is not limited thereto. In operation S1200, the controller 1000 may control the heating element 270 to gradually raise or lower a surface temperature of the heating chuck 200 based on a signal received from the temperature sensor 280.

In an example embodiment, in operation S1200, the controller 1000 may control the heating element 270 such that a temperature of the substrate S mounted on the heating chuck 200 is heated to a temperature of about 55° C. to about 95° C.

When the substrate S is heated to a temperature lower than about 55° C. during an HEA test, the intensities of photon emission and thermal emission that occur in the first test portion A1 of the substrate S may be relatively reduced in operations S1300 and S1400 that will be described below. Otherwise, when the substrate S is heated to a temperature higher than about 95° C. during the HEA test, the intensities of photon emission and thermal emission may be relatively increased in the entire region of the first test portion A1 of the substrate S. Accordingly, in operation S1400, noise in images of photon emission and thermal emission, which are captured by a camera 500, may increase.

In an example embodiment, in operation S1200, the controller 1000 may control the heating element 270 such that a temperature of the substrate S mounted on the heating chuck 200 is heated to a temperature of about 70° C. to about 95° C. Because the temperature of the substrate S is controlled by the controller 1000 to be in a range of about 70° C. to about 95° C., photon emission and thermal emission in the first test portion A1 of the substrate S may be increased, and thus, defects in the first test portion A1 may be easily detected. Also, noise in images of photon emission and thermal emission, which are captured by the camera 500 of a substrate testing apparatus 10, may also be reduced.

Figure 15:
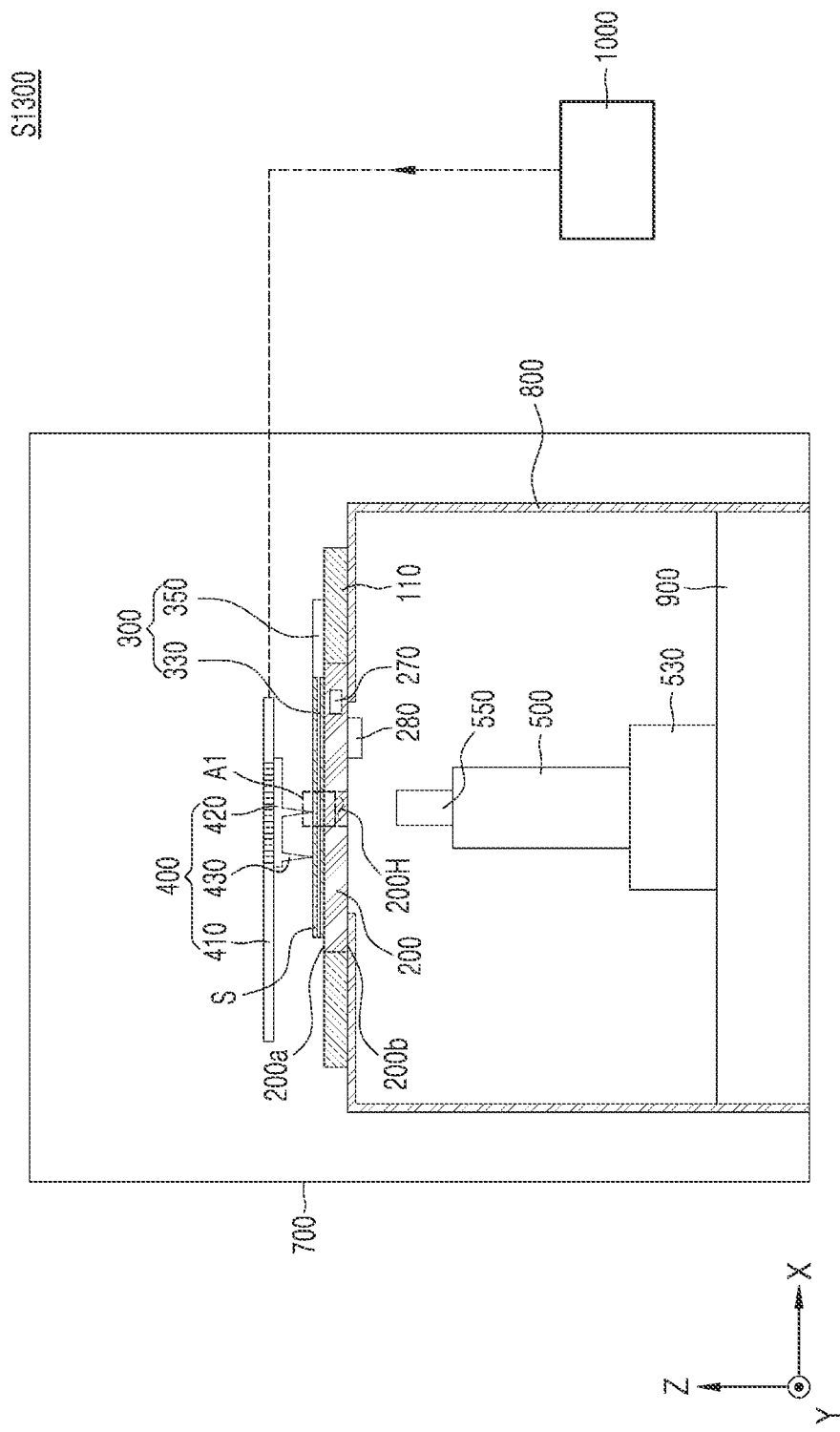

Referring to FIGS. 12 and 15, the substrate testing method S100 according to the example embodiment may include applying a voltage to the first test portion A1 of the substrate S (S1300).

In operation S1300, a probe device 400 may apply a voltage to the substrate S. In other words, the probe device 400 may apply an electric signal to the substrate S mounted on the heating chuck 200.

In operation S1300, the probe device 400 may move in at least one of the lateral direction and the vertical direction. For example, the probe device 400 may move in the lateral direction so that the probe pin 430 of the probe device 400 may overlap the first test portion A1 of the substrate S in the vertical direction. In addition, the probe device 400 may move in the vertical direction so that the probe pin 430 of the probe device 400 may come into contact with the first test portion A1 of the substrate S.

In operation S1300, the controller 1000 may control the probe device 400 to adjust the intensity of the voltage applied to the first test portion A1 of the substrate S. When the probe device 400 applies the voltage to the first test portion A1 of the substrate S, photon emission and thermal emission may occur in the first test portion A1 of the substrate S. In addition, photon emission and thermal emission may concentrate in a portion with many defects in the first test portion A1 of the substrate S.

Figure 16:
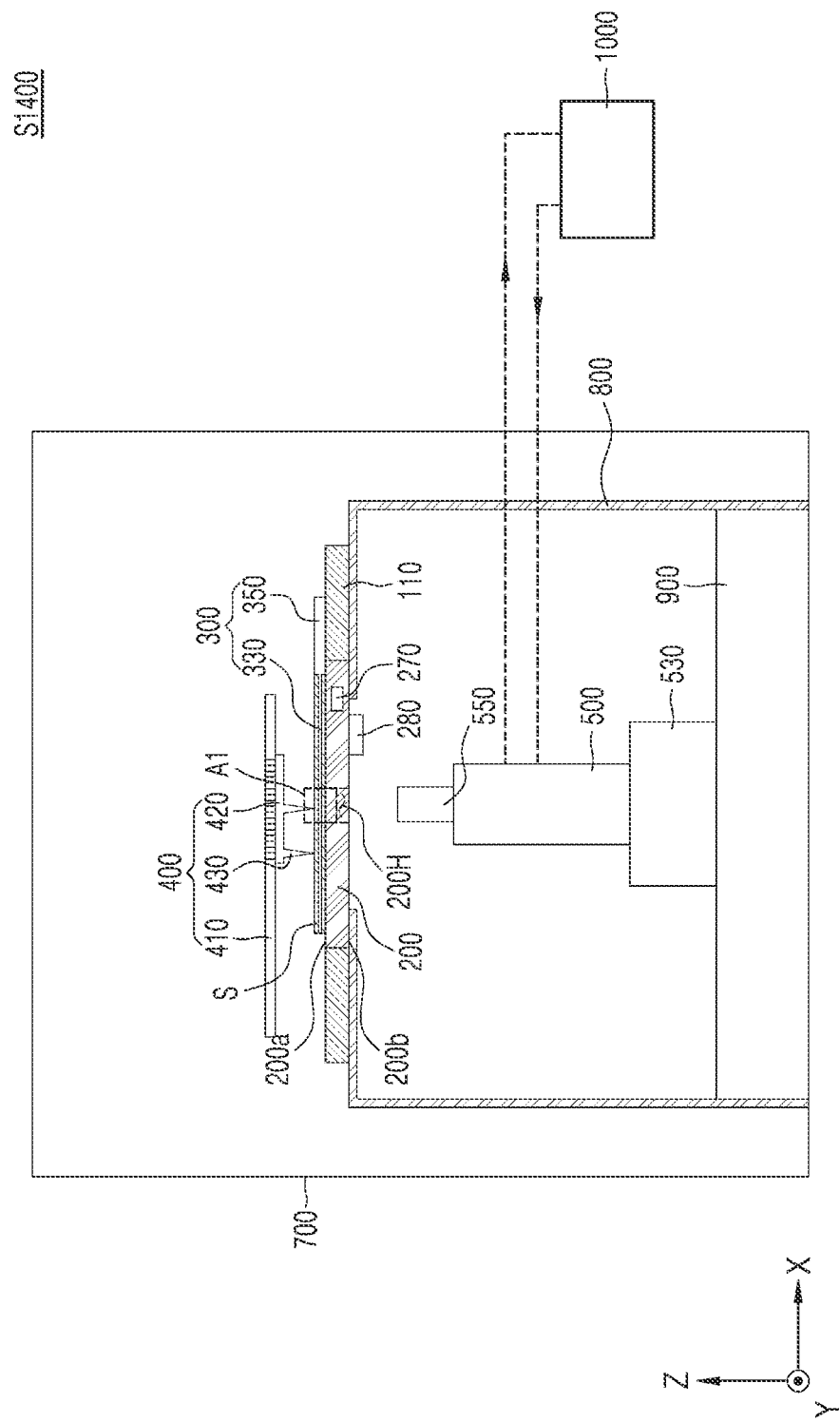

Referring to FIGS. 12 and 16, the substrate testing method S100 according to the example embodiment may include photographing the first test portion A1 of the substrate S (S1400).

In operation S1400, the controller 1000 may control the camera 500, the camera driving device 530, and a lens 550 to obtain images related to photon emission and thermal emission in the first test portion A1 of the substrate S.

For example, the controller 1000 may move the camera 500 by controlling the camera driving device 530. Also, the controller 1000 may select any one of a plurality of lenses 550, based on a type and focus of the camera 500.

In operation S1400, the first test portion A1 of the substrate S, which overlaps the photographing aperture 200H of the heating chuck 200 in the vertical direction, may be exposed to an inner space of the housing 800. Thus, the camera 500 may photograph the first test portion A1 of the substrate S.

Furthermore, the camera 500 may transmit an image of photon emission and/or thermal emission in the first test portion A1 of the substrate S to the controller 1000. Thus, the controller 1000 may analyze the image captured by the camera 500 and detect a stand-by failure in the first test portion A1 of the substrate S.

In an example embodiment, when the camera 500 includes a PHEMOS device, the camera 500 may photograph photon emission, which occurs in the first test portion A1 of the substrate S to which a voltage is applied. Thus, the controller 1000 may analyze an image captured by the camera 500 and detect a defect in the first test portion A1 of the substrate S. For example, the controller 1000 may detect a leakage current, which occurs in a PN junction or an oxide film in the stand-by state of the substrate S.

Furthermore, when the camera 500 includes a THEMOS device, the camera 500 may photograph heat generated by the first test portion A1 of the substrate S to which the voltage is applied. Accordingly, the controller 1000 may analyze the image captured by the camera 500 and detect a defect in the first test portion A1 of the substrate S.

The substrate testing method S100 according to the example embodiment may heat the substrate S by using the heating chuck 200 during the HEA test. Accordingly, during the HEA test, photon emission and thermal emission in the first test portion A1 of the substrate S may be increased, and the substrate testing method S100 may enable precise detection of defects in the first test portion A1 of the substrate S.

Figure 17:
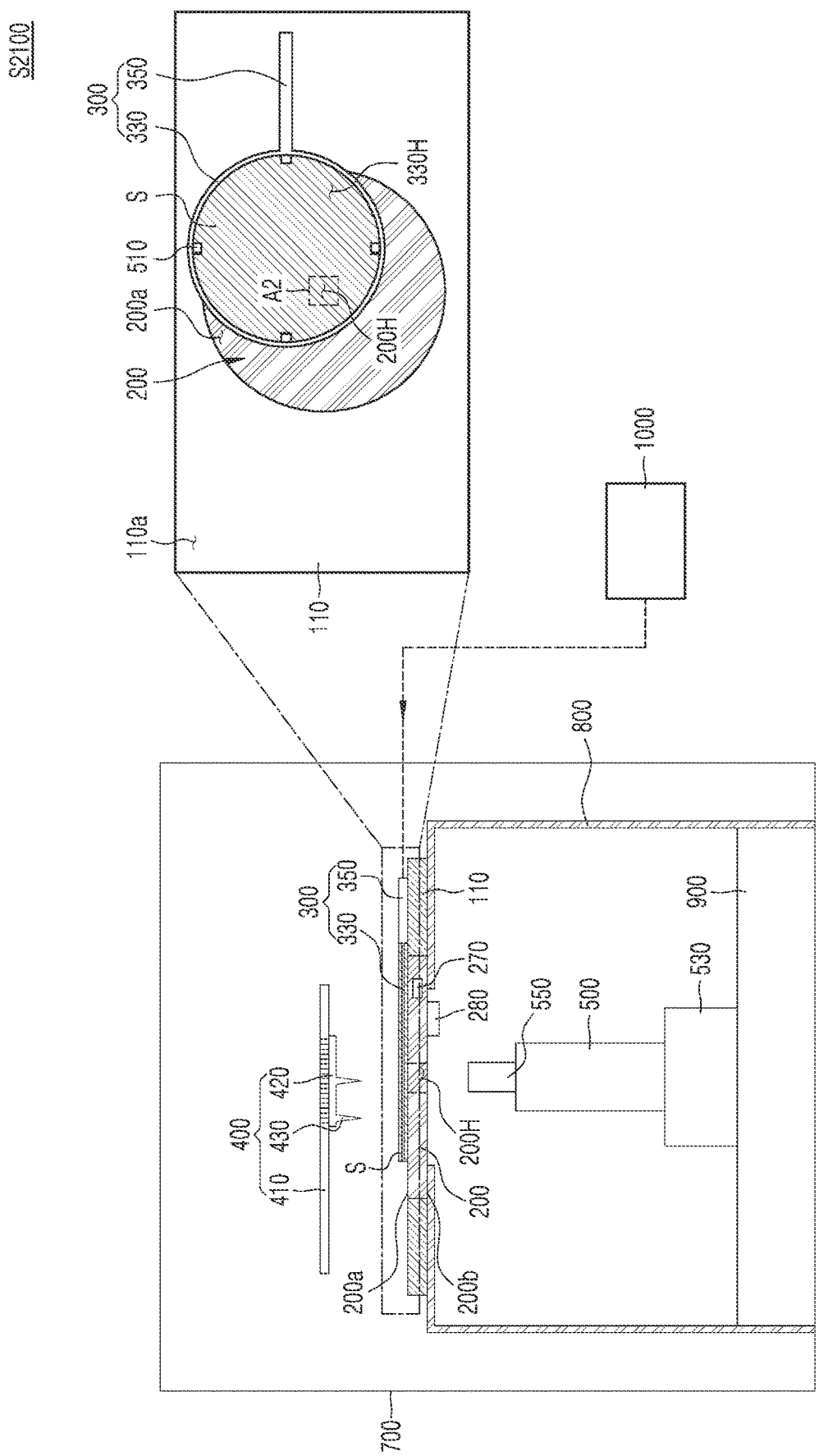

Referring to FIG. 17, after operation S1400, the substrate testing method S100 may further include arranging the second test portion A2 of the substrate S (S2100).

In operation S2100, the substrate moving device 300 may move the substrate S in the lateral direction such that the second test portion A2 of the substrate S overlaps the photographing aperture 200H of the heating chuck 200 in the vertical direction.

In operation S2100, the controller 1000 may control a temperature of the substrate S by controlling the heating element 270 of the heating chuck 200. For example, in operation S1200, the controller 1000 may control the heating element 270 such that the second test portion A2 of the substrate S is heated to the same temperature as a temperature to which the first test portion A1 of the substrate S is heated.

In another case, in operation S1200, the controller 1000 may control the heating element 270 such that the second test portion A2 of the substrate S is heated to a temperature different from the temperature to which the first test portion A1 of the substrate S is heated.

After operation S2100, an operation of photographing the second test portion A2 of the substrate S may be performed. Because the operation of photographing the second test portion A2 of the substrate S is the same as operation S1400, a detailed description thereof will be omitted.

While the inventive concept has been particularly shown and described with reference to embodiments thereof, it will be understood that various changes in form and details may be made therein without departing from the scope of the following claims.

What is claimed is:

1. A substrate testing apparatus configured to perform a hot electron analysis (HEA) test for analyzing a stand-by failure in a substrate, the substrate testing apparatus comprising:
    a heating chuck comprising a first surface configured to support the substrate, a second surface opposite to the first surface, and an aperture that extends through the first surface and the second surface, and wherein the heating chuck is configured to heat the substrate;
    a substrate moving device configured to move the substrate on the heating chuck in a lateral direction; and
    a camera configured to photograph the substrate through the heating chuck aperture.

2. The substrate testing apparatus of claim 1, wherein the heating chuck comprises:
    an upper plate having a first aperture;
    a lower plate combined with the upper plate, the lower plate having a second aperture that overlaps the first aperture; and
    a heating element on an inner surface of the lower plate, wherein the heating element is configured to heat the upper plate and the lower plate.

3. The substrate testing apparatus of claim 2, wherein the heating element comprises a ceramic heater, the ceramic heater comprising a ceramic plate and a heating body embedded in the ceramic plate.

4. The substrate testing apparatus of claim 3, wherein an upper surface of the heating element is in contact with the upper plate, and
    a lower surface of the heating element is in contact with the lower plate.

5. The substrate testing apparatus of claim 2, wherein the upper plate and the lower plate comprise aluminum.

6. The substrate testing apparatus of claim 1, wherein the substrate moving device comprises:
    a substrate fixing portion configured to surround a peripheral edge of the substrate; and
    a substrate moving portion having an elongate shape that extends from an outer surface of the substrate fixing portion.

7. The substrate testing apparatus of claim 2, further comprising:
    a temperature sensor configured to measure a temperature of the heating chuck; and
    a controller connected to the temperature sensor, wherein the controller is configured to control a temperature of the heating element based on a signal received from the temperature sensor.

8. The substrate testing apparatus of claim 7, wherein the controller is configured to control the temperature of the heating element such that the substrate on the heating chuck is heated to a temperature of about 55° C. to about 95° C.

9. A substrate testing apparatus configured to perform a hot electron analysis (HEA) test for analyzing a stand-by failure in a substrate, the substrate testing apparatus comprising:
    a support plate comprising a mounting opening;
    a heating chuck positioned within the mounting opening of the support plate, the heating chuck comprising a first surface configured to support the substrate, and second surface opposite to the first surface, and an aperture that extends through the first surface and the second surface, and wherein the heating chuck is configured to heat the substrate;
    a substrate moving device surrounding a peripheral edge of the substrate, the substrate moving device configured to move the substrate on the support plate and the heating chuck in a lateral direction;
    a camera configured to photograph a test portion of the substrate exposed through the heating chuck aperture; and
    a probe device configured to apply a voltage to the test portion of the substrate.

10. The substrate testing apparatus of claim 9, wherein the camera is configured to capture an image of at least one of photon emission and thermal emission, which occur in the test portion of the substrate.

11. The substrate testing apparatus of claim 10, wherein the camera comprises at least one of an indium-gallium-arsenic (InGaAs) camera comprising a compound semiconductor comprising indium (In), gallium (Ga), and arsenic (As), and an indium-antimony (InSb) camera comprising a compound semiconductor comprising indium (In) and antimony (Sb).

12. The substrate testing apparatus of claim 9, further comprising:
    a camera driving device configured to move the camera in at least one of the lateral direction and a vertical direction; and
    a lens configured to refract light detected by the camera.

13. The substrate testing apparatus of claim 9, wherein the heating chuck comprises:
    an upper plate having a first aperture;
    a lower plate combined with the upper plate, the lower plate having a second aperture that overlaps the first aperture; and
    a heating element on an inner surface of the lower plate, wherein the heating element is configured to heat the upper plate and the lower plate.

14. The substrate testing apparatus of claim 13, wherein the heating element comprises a ceramic heater, the ceramic heater comprising a ceramic plate and a heating body embedded in the ceramic plate.

15. A substrate testing apparatus configured to perform a hot electron analysis (HEA) test for analyzing a stand-by failure in a substrate, the substrate testing apparatus comprising:

a chamber comprising a process space;

a housing in the process space of the chamber, the housing comprising an upper surface with an opening therein;

a heating chuck comprising a first surface configured to support the substrate, a second surface opposite to the first surface, and an aperture that extends through the first surface and the second surface, wherein the heating chuck is positioned on the upper surface of the housing such that a portion of a lower surface of the heating chuck is exposed by the housing opening, wherein the heating chuck is configured to heat the substrate;

a substrate moving device surrounding a peripheral edge of the substrate, wherein the substrate moving device is configured to move the substrate on the heating chuck in a lateral direction;

a camera positioned within the housing and configured to photograph a test portion of the substrate that is exposed through the heating chuck aperture; and a probe device positioned within the process space of the chamber and configured to apply a voltage to the test portion of the substrate.

16. The substrate testing apparatus of claim 15, further comprising a support plate on the upper surface of the housing, the support plate surrounding a peripheral edge of the heating chuck, wherein the substrate moving device comprises:
a substrate fixing portion configured to surround a peripheral edge of the substrate; and
a substrate moving portion having an elongate shape that extends from an outer surface of the substrate fixing portion.

17. The substrate testing apparatus of claim 16, wherein an upper surface of the support plate is coplanar with an upper surface of the heating chuck.

18. The substrate testing apparatus of claim 15, wherein the heating chuck comprises:
an upper plate having a first aperture;
a lower plate combined with the upper plate, the lower plate having a second aperture that overlaps the first aperture; and
a heating element on an inner surface of the lower plate, the heating element configured to heat the upper plate and the lower plate, wherein the substrate testing apparatus further comprises:
a temperature sensor configured to measure a temperature of the heating chuck; and
a controller connected to the temperature sensor, wherein the controller is configured to control a temperature of the heating element based on a signal received from the temperature sensor.

19. The substrate testing apparatus of claim 15, further comprising a controller connected to the camera and the substrate moving device, wherein the controller is configured to operate the substrate moving device such that, after a first test portion of the substrate is photographed by the camera, a second test portion of the substrate that is different from the first test portion of the substrate is exposed through the heating chuck aperture.

20. The substrate testing apparatus of claim 16, wherein the probe device comprises:
a pogo block configured to form circuit patterns;
a probe card connected to the pogo block and configured to receive an electrical signal from the pogo block; and
a probe pin connected to the probe card and configured to transmit the electrical signal received from the probe card to the substrate.

* * * * *